United States Patent [19]

Riechelmann

[11] Patent Number: 4,836,797
[45] Date of Patent: Jun. 6, 1989

[54] ELECTRICAL DEVICE CONTACTOR

[75] Inventor: Bernd Riechelmann, San Diego County, Calif.

[73] Assignee: Sym-Tek Systems, Inc., San Diego, Calif.

[21] Appl. No.: 942,244

[22] Filed: Dec. 16, 1986

[51] Int. Cl.⁴ ............................................ G01R 31/02
[52] U.S. Cl. ................................ 439/264; 324/158 F; 439/912
[58] Field of Search .................. 439/259, 262–265, 439/266, 268, 269, 912; 324/158 F

[56] References Cited

U.S. PATENT DOCUMENTS

| | | | |
|---|---|---|---|
| 3,715,662 | 2/1973 | Richelmann | 324/158 F |
| 3,848,221 | 11/1974 | Lee, Jr. | 324/158 F |
| 4,068,170 | 1/1978 | Chayka et al. | 324/158 F |
| 4,284,314 | 8/1981 | Lesyk | 439/264 |
| 4,370,011 | 1/1983 | Suzuki et al. | 439/264 |
| 4,473,798 | 9/1984 | Cedrone et al. | 439/912 |
| 4,574,235 | 3/1986 | Kelly et al. | 324/158 |

Primary Examiner—Neil Abrams
Attorney, Agent, or Firm—Brown, Martin, Haller & McClain

[57] ABSTRACT

A contact leaf bank for an electrical contactor preferably etched from a single uniform sheet of resiliently flexible, electrically conductive material comprises a ground sheet defining a plurality of uniformly-spaced, elongated, parallel slots in which are singularly disposed a plurality of resiliently flexible, elongated leaves each having and end portion adapted to be a contact finger, the tip of each contact finger preferably being rhodium-plated for hardness. A pair of spaced and opposing contact leaf banks are two elements of a contact assembly which further comprises a base member in which a base end of each contact leaf bank is anchored, a device rail which in one form is a single track upon which an electrical device rides is centrally interposed between the contact leaf banks, the device rail being adapted to seat a device such that side leads of the device are aligned with the contact fingers and the spacing of the contact banks being such that the banks can be bent inboardly to make wiping contact between the device leads and the contact fingers, a pair of rockers one affixed to each bank at an end opposite the bank's anchored end and adapted to be reciprocatingly rocked or rotated toward and away from the device rail by an over-travel compensated actuating mechanism, the portion of each contact leaf bank between its respective rocker and the base member acting as a resilient hinge, and connector adaptors housed in the base member for providing electrical communication between the contact fingers and connectors also housed in the base member.

14 Claims, 6 Drawing Sheets

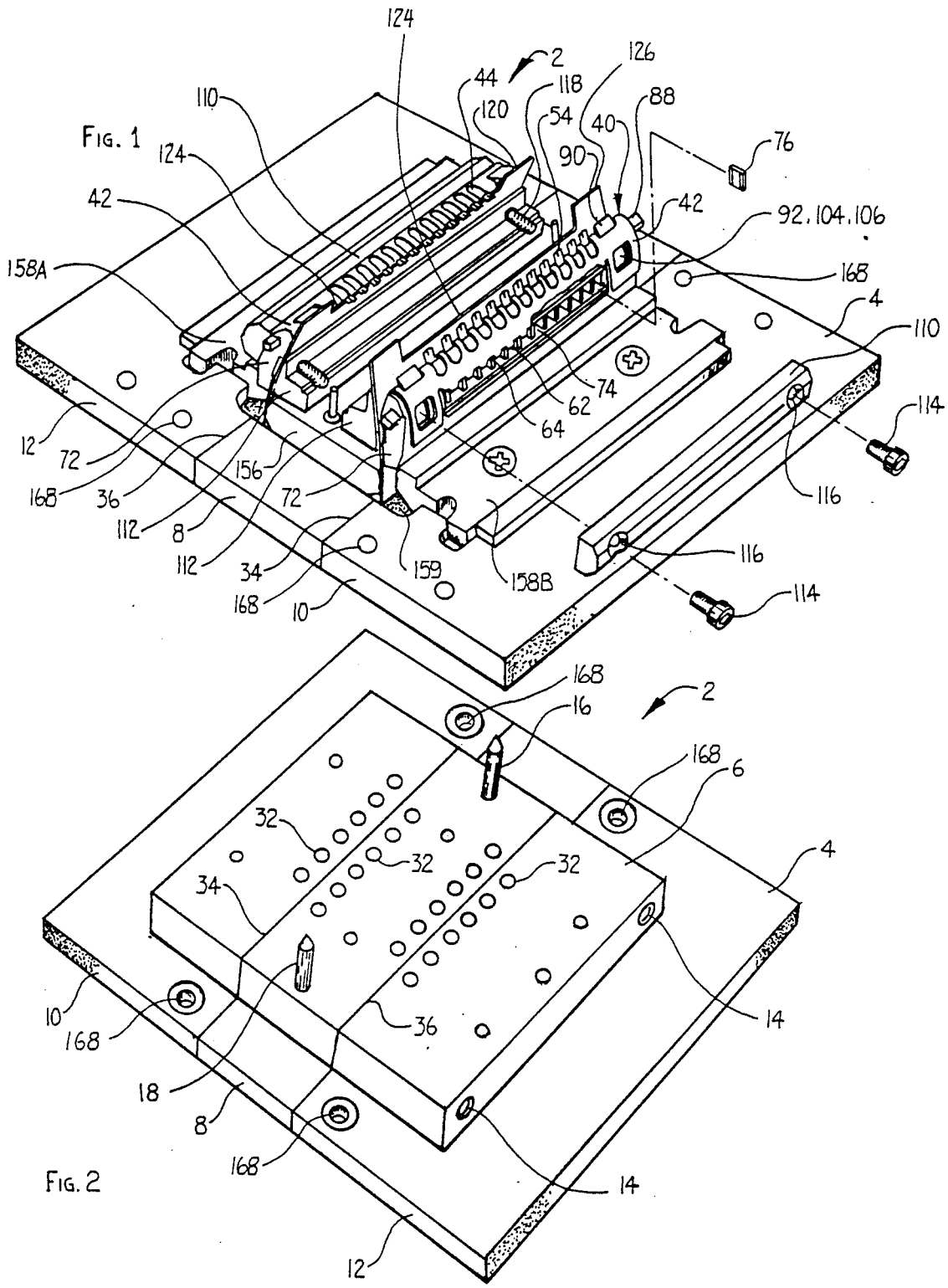

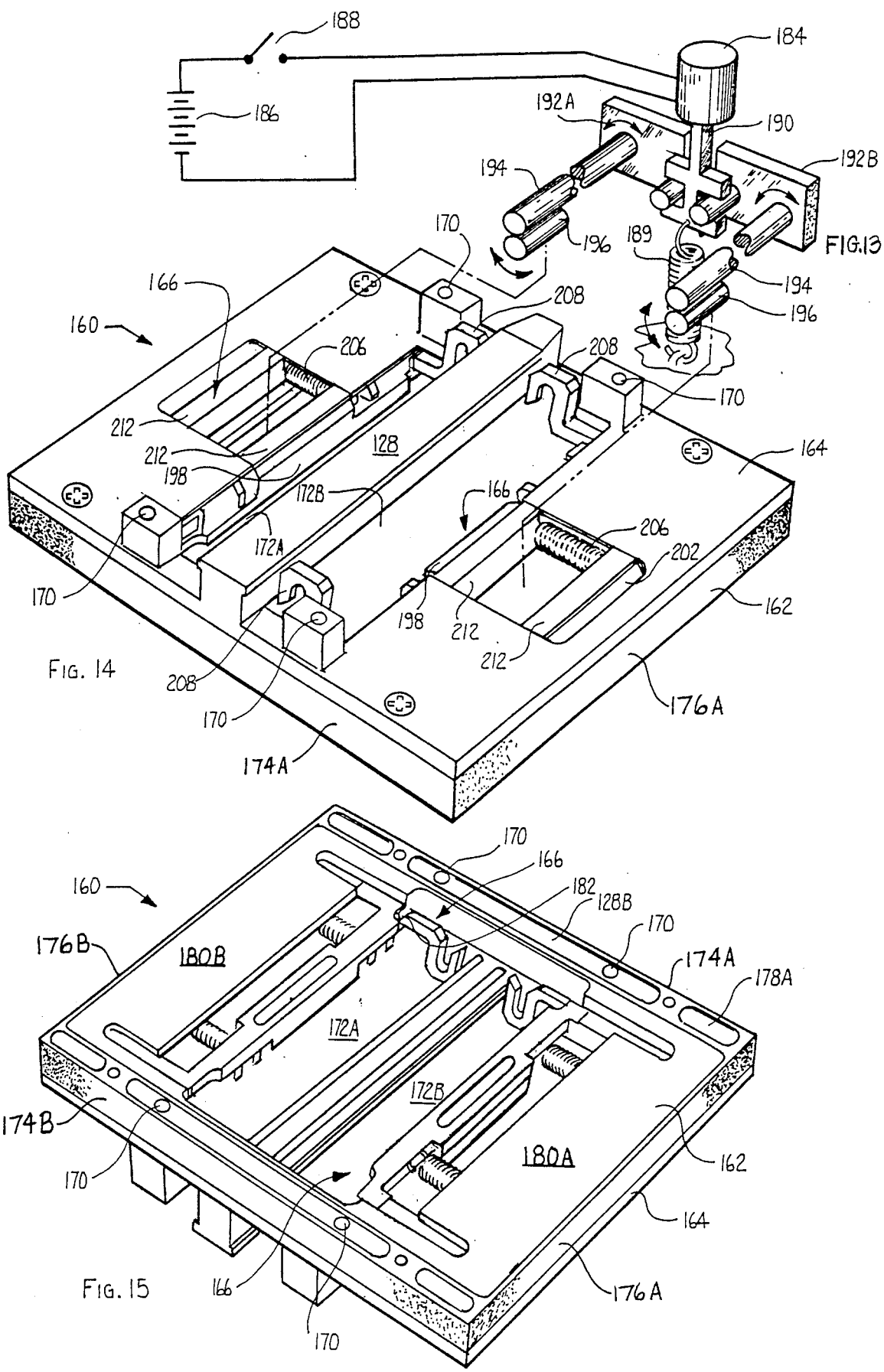

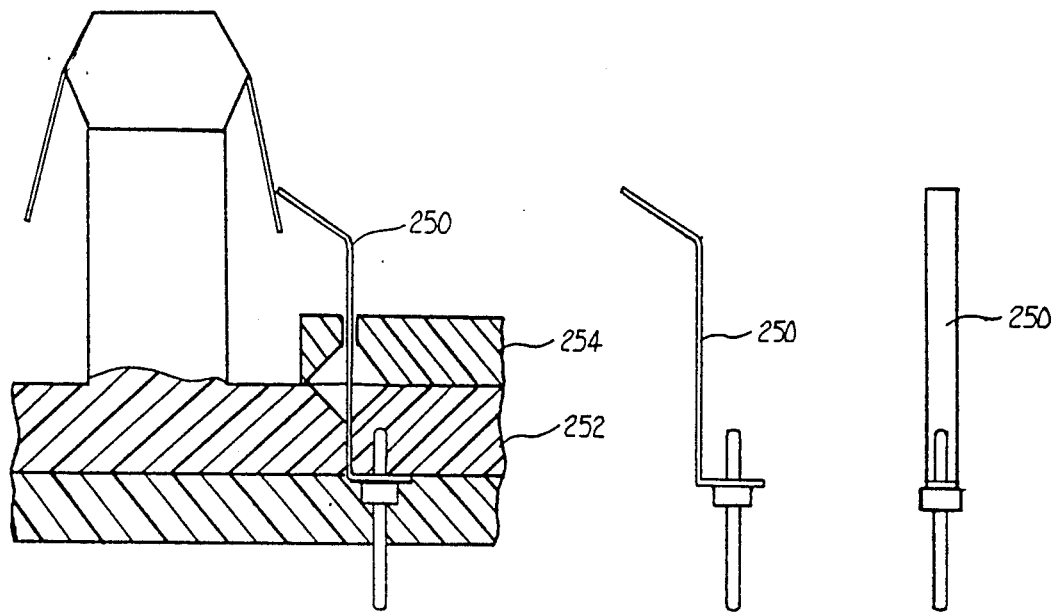
FIG. 17
PRIOR ART
FIG. 18
PRIOR ART
FIG. 19
PRIOR ART
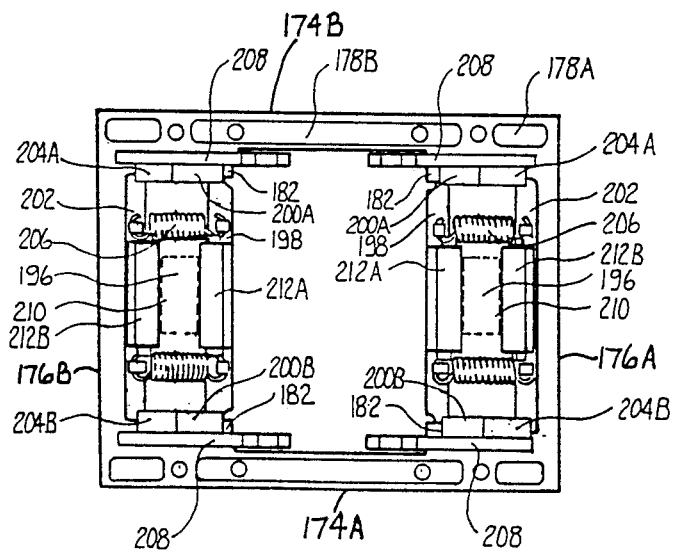
FIG. 16

ELECTRICAL DEVICE CONTACTOR

BACKGROUND OF THE INVENTION

This invention relates in general to electrical contactors used to make temporary contact with the leads of electrical devices, especially for testing purposes.

Prior art contactors consist of a plurality of individually manufactured and individually assembled contact leaves with no means of controlling the electrical characteristic impedance of the leaves, so that, in addition to being very costly to manufacture, the contactors create impedance anomalies between the test electronics and a device under test. Such anomalies tend to cause signal reflections which deteriorate the rise and fall times of test signals. Heretofore this has been acceptable for most devices because the deterioration was within acceptable limits due to the relatively slow rise and fall times, and therefore low frequency of the major components present in the test signals. But there is now an urgent need for a high frequency contactor, one whose characteristic impedance substantially matches that of the transmission medium between the contactor and the test electronics so that the faster rise and fall times of higher frequency test signals can be passed through a contactor substantially unaffected by the contactor. By maintaining the integrity of the rise and fall times of the signals, accurate testing of high speed devices is made possible.

A contactor without high frequency capability, however, would add artifacts to the signal, which mimic the characteristics of a defective device, therefore resulting in costly rejection of good devices.

Other advantages and attributes of this invention will be readily discernible from a reading of the text hereinafter.

SUMMARY OF THE INVENTION

This invention presents a contact leaf bank for an electrical contactor comprising a uniform sheet of resiliently flexible, electrically conductive material, a plurality of elongated strips of resiliently flexible, electrically conductive material, a corresponding plurality of elongated, parallel slots defined by the sheet in which the strips are centrally disposed, one strip for each slot, a portion of the strips being generally coplanar with the sheet and corresponding end portions (herein called contact fingers) of the strips being divergent from the plane of the sheet, and means securing the strips and the sheet in relation to each other. Preferably the sheet and strips are photo-etched from a single sheet of a copper-nickel or copper-berylium alloy, and the strips (herein called contact leaves) are secured in the slots by laminations. A contact assembly comprises a pair of spaced contact leaf banks, a base member in which a base end of each contact leaf bank is anchored, such that the contact fingers of one bank faces the contact fingers of the other bank, a device rail interposed between the banks and adapted to seat an electrical device such that the side exiting leads of the device are aligned with the contact fingers, a rocker means affixed to each bank at an end opposite to the anchored bank end and adapted to be rotated toward and away from the device rail by an over-travel compensated actuating mechanism, the respective contact leaf bank of each rocker means acting as a hinge, adaptor means housed in the base plate by which the contact leaves are in electrical communication with connectors preferably also housed in the base plate.

An object of this invention is to provide a device contactor with a uniform and controlled characteristic impedance.

A further object of this invention is to provide a device contactor with a characteristic impedance which substantially matches the impedance of the transmission medium between the test electronics and the contactor.

A further object of this invention is to provide a device contactor with a characteristic impedance which substantially matches the characteristic impedance of a coaxial cable.

A further object of this invention is to permit connection of power supply filter capacitors to the device via short leads having low impedance.

A further object is to permit easy fabrication and replacement of a multitude of small contacts by cutting them photochemically as a set, and securing them in relation to each other by laminating.

A further object of this invention is to fabricate a contact assembly which serves the dual purpose of flexible contacts as well as forming a multi-conductor controlled impedance transmission line, thus reducing parts count and assembly time, and therefore cost.

BRIEF DESCRIPTION OF DRAWINGS

FIG. 1 is a perspective view of a contact leaf bank.

FIG. 2 is a perspective view of a reverse side of the contact leaf bank of FIG. 1.

FIG. 13 is a perspective view of a contactor drive mechanism.

FIG. 14 is a perspective view of a top side of a contactor bridge.

FIG. 15 is a perspective view of a bottom side of the bridge.

FIG. 16 is a plan view of the bridge with a cover removed.

FIG. 17 is a partial section of a conventional contactor.

FIG. 18 is a side view of a conventional contact finger.

FIG. 19 is a front view of the conventional contact finger.

DESCRIPTION OF PREFERRED EMBODIMENT

Figure 3:
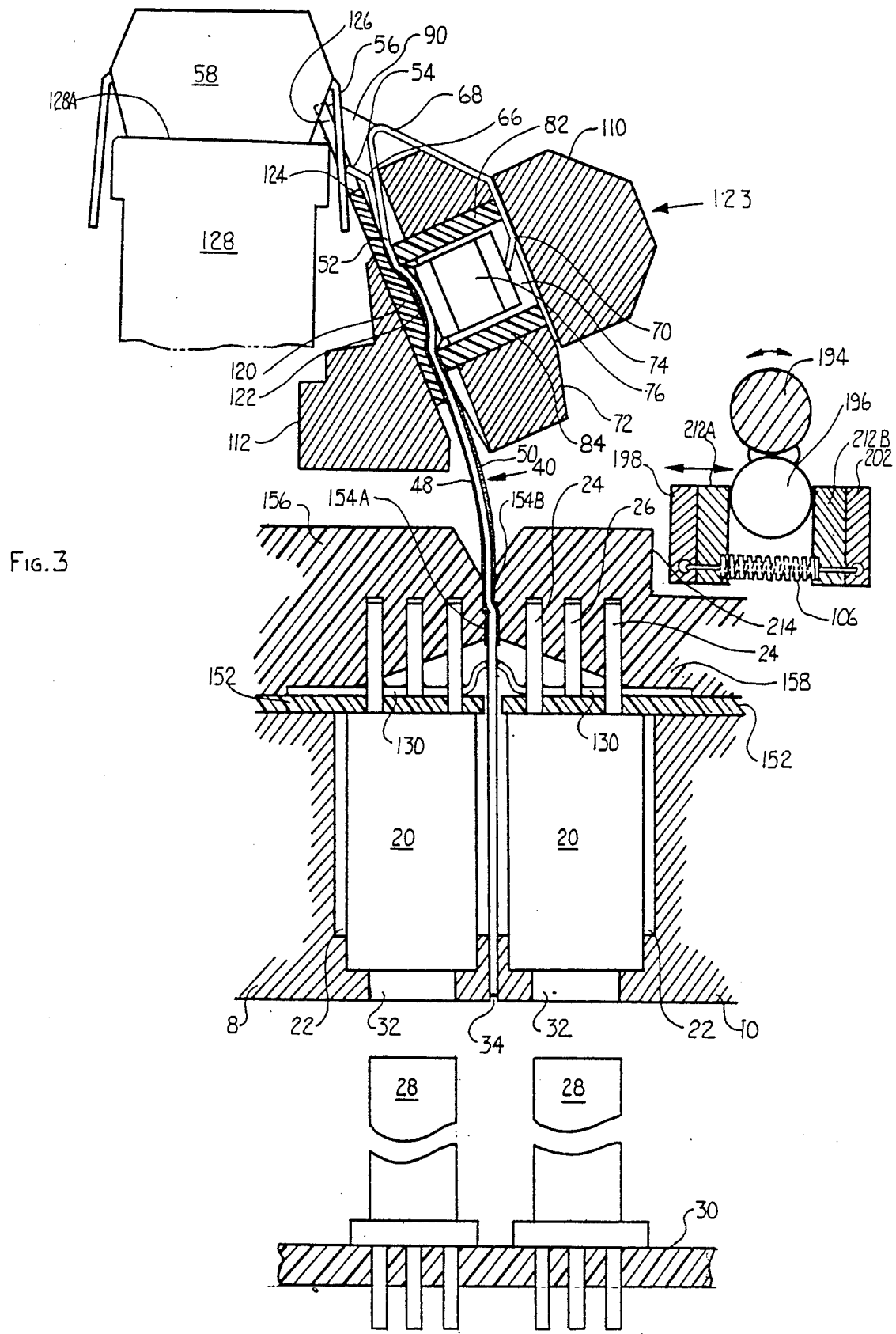
FIG. 3 is a partial sectional view of the contact leaf bank of FIGS. 1 and 2.

Referring to FIGS. 1, 2 and 3, a contact assembly, generally designated 2 is shown to have a base plate 4 with an integral and centrally disposed raised portion 6. The base 4 is formed by a central base piece 8 being joined edgewise with and between two outer base pieces, 10 and 12, by means of a plurality of recessed socket head bolts 14. Projecting normally from the raised portion 6 are a pair of spaced guide pins, 16 and 18, which engage matching guide holes in printed circuit board 30. The raised portion 6 defines a plurality of cavities 22 in which are housed a pluralilty of coaxial connectors 20. The coaxial connectors 20 are preferably miniature high frequency connectors or the like with each connector having a plurality of solderable ground leads 24 and a signal lead 26 projecting from one end of a barrel housing, the other end being adapted to couple with a mating coaxial connector 28 typically mounted on a printed circuit board 30 which comprises or interfaces to device test electronics. A plurality of connector apertures 32 defined by the raised portion 6 of the base plate 4 expose a mating end of the housed connectors 20 to permit said coupling. The outer base pieces 10 and 12 each define a cavity 22 and a plurality of apertures 32 adjacent their respective junctions, 34 and 36, with the central base piece, such that a line of uniformly-spaced coaxial connectors 20 can be housed adjacent to and parallel with each junction. The central base piece defines a cavity 22 and a plurality of apertures 32 adjacent each of the junctions, 34 and 36, such that a line of uniformly-spaced coaxial connectors 20 can be housed by the central base piece adjacent to and parallel with each junction. Thus, at each junction of the central base piece and an outer base piece there are two parallel lines of coaxial connectors, one line on either side of the junction. Preferably the spacing in each line of the two connector lines at a junction is equal, the number of connectors in each line is equal, and the two lines are linearly skewed by an amount equal to half the distance between adjacent connectors. Preferably the base plate 4 is made from aluminum, gold plated.

Referring to FIGS. 1 and 3-5, a contact leaf bank, generally designated 40, is shown to comprise a sheet of resiliently flexible, electrically conductive material in the form of a generally rectangular ground frame 42 defining a plurality of uniformly-spaced, elongated, uniform, parallel slots 44 in which are disposed a corresponding plurality of uniform, elongated strips of resiliently flexible, electrically conductive material in the form of contact leaves 46, one contact leaf centrally disposed in each slot and held therein by laminates, 48 and 50, which sandwich the ground frame and contact leaves therebetween. The contact leaves are coplanar with the ground frame except beyond a line of divergence 52. An end portion of each contact leaf which diverges from the plane of the ground frame is a serrated-tip contact finger 54 adapted to make electrical contact with the leads 56 of a device under test 58. A portion of a top side 60 of the ground frame, the side proximate and normal to the contact fingers 54, is scalloped or crenelated with each merlon 62 aligned with one of the contact leaves and each crenel 64 aligned with one gap between contact leaves. Preferably both the ground frame and the contact leaves are made from a berylium and nickel or copper alloy which has good electrical conductivity and is resiliently flexible with high mechanical strength and endurance, and both are gold-plated except for the serrated tips of the contact fingers 54 of the leaves which are rhodium-plated to make them hard and wear resistant. The hardness of the contact fingers is advantageous because in operation the fingers wipe against the device leads 56 and must penetrate surface contamination on the leads.

Referring again to FIGS. 1 and 3-5, the contact leaf bank 40 is shown in FIG. 4 to be in an unformed state, and is shown in the other figures to be in a formed state. The formed state comprises a first uniform angular bend 66 of all contact fingers 54 along a line normal to the contact leaves 46 diverging the fingers from the plane of the contact leaf bank, a generally hook-shaped bend 68 of the ground frame 42 beginning along a line near and parallel to the bend 66 of the contact fingers and divergent from the bend 66, and a second angular bend 70 of the ground frame crenelations inward toward the contact leaves. The bends are made by deforming the items beyond their memory. The angular bend 66 at the contact fingers is adapted to cause the contact fingers to impinge the device leads at an optimally advantageous angle. The hook-shaped bend 68 is adapted to fold the ground frame away from the bent contact fingers and to conform the ground frame around an elongated rocker bar 72. The bend 70 of the crenelations are adapted to cause the merlons 62 to project at an optimally advantageous angle into a plurality of component cells 74 to make electrical contact with an electrod of a component 76, e.g. a by-pass capacitor.

Figures 7, 8:
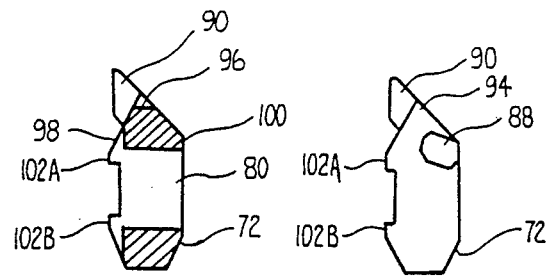
FIG. 7 is a sectional view of the rocker bar taken along line 7—7 of FIG. 6.
FIG. 8 is an end view of the rocker bar of FIG. 6.
Figure 6:
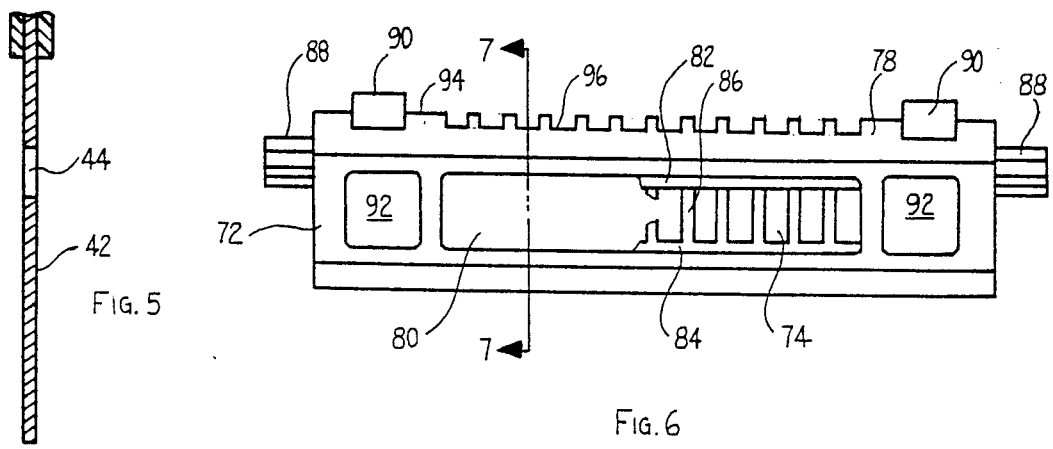
FIG. 6 is a front view of a rocker bar and a portion of some component cells disposed therein.

Referring to FIGS. 6-8, a rocker bar 72 is seen to comprise an elongated body 78 which defines a longitudinal slot 80 in which is disposed a plurality of component cells 74 only some of which are shown in FIG. 6. The component cells are defined by a first and second slat, 82 and 84, of insulating material which both run the length of the slot 80, and between said slats are a plurality of uniformly spaced partitions 86 of insulation material running transverse to the slot 80. Projecting axially from opposite ends of the body 78 are a pair of dogs 88 by which the rocker bar is rotated toward and from the device 58 as will be explained. Projecting radially from the body at opposite ends of said body are a pair of stops 90. The body also defines a pair of bolt through-holes 92 proximate opposite ends of said body. Optionally, an angle edge 94 around which the saddle of the hook-shaped bend 68 of the ground frame is hooked is crenelated with the crenels 96 corresponding in number and aligning with the contact fingers 54. Recessing the fingers between the merlons thereof is a way of protecting them while the crenels permit visual inspection of the contact fingers. The body 78 has two major sides, an inner side 98 which faces toward the contact fingers 54 and an outer side 100 which faces toward the crenels 62 of a formed contact leaf bank. The inner side 98 has projecting therefrom at each end of the body 78 a pair of spaced shoulders 102A and 102B which crimp the contact leaf bank to hold it in place as will be explained.

Figure 4:
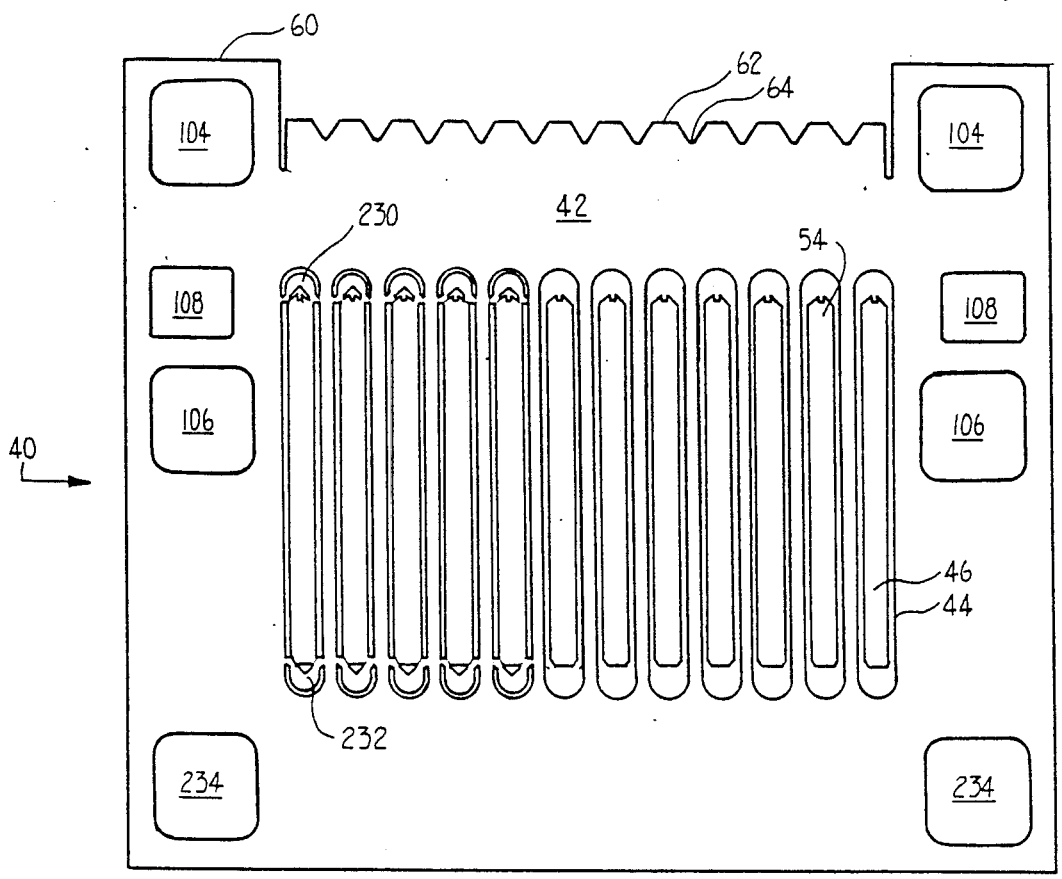
FIG. 4 is a plan view of a partially unfinished and unformed contact leaf bank.
Figure 5:
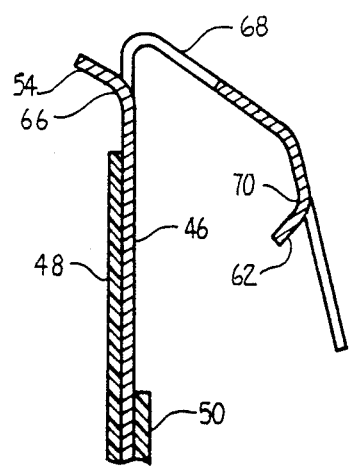
FIG. 5 is a section of a finished and formed contact leaf bank taken along a line colinear with a longitudinal axis of a contact leaf.

Referring to FIGS. 1, 4 and 6, the contact leaf bank 40 at the corners of side 60 defines a first pair of bolt holes 104, and intermediate side 60 and its opposite side, the contact leaf bank defines a second pair of bolt holes 106. When the formed contact leaf bank is hooked around the rocker bar, these bolt holes 104 and 106 align with the rocker bolt holes 92, and intermediate the bolt holes 104 and 106 are a pair of stop holes 108 through which project the rocker stops 90.

Referring to FIGS. 1, 3 and 5-7, the contact leaf bank 40 when it is hooked around the rocker bar 72 is clamped to the rocker bar by means of a component cover bar 110 and a support bar 112. A pair of bolts 114 extend through bolt holes 116 defined by the component cover bar, extend through the ground frame and rocker bolt holes 92, 104 and 106, and mate with threaded bores 118 defined by the support bar. The component cover bar bear against the outer side 100 of the rocker bar and vises therebetween the hooked ground plane. Interposed between the inner side 98 of the rocker bar and the support bar is an elongated guard plate 120 and a portion of the contact leaf bank 40. The guard plate 120 runs the length of the rocker bar with one side abutting the support bar and the other side abutting the contact leaf bank, said other side having a longitudinal land 122 running the length of the plate, the width of the land 122 being suitably less than the gap between the rocker shoulders 102A and 102B such that when the support bar is made to bear forcefully against the guard plate by the bolts 114, the land 122 deforms and pushes the contact leaf bank into the rocker shoulder gaps thereby crimping the contact leaf bank. Intermediate the pairs of shoulders 120A and 120B, the land also deforms and pushes a portion of the contact leaf bank into a gap between the component cell slats 8 and 84 which project from the inner side 98 coextensively with the shoulders 120A and 120B, respectively. Thus, the contact leaf bank is crimped laterally, along the land 122, between the rocker bar and the guard bar. The contact leaf bank, the guard plate, the rocker bar with component cells, the component cover bar, and the support bar as assembled and bolted as in FIG. 3 are collectively called a rocker assembly which is generally designated 123.

The crimping of the contact leaf bank accomplishes several things. Firstly, it prevents movement of the contact leaf bank with respect to the rocker bar. Secondly, the crimping causes the crimped portion of the contact leaves to bow toward their respectively aligned component cells 74 in order to make good electrical contact with an electrode of a component 76 therein. Thus, one electrode of a component in a cell is in electrical contact with a crimped portion of a contact leaf 46 and the other electrode is in electrical contact with a ground frame merlon 62. If the ground frame is at electrical ground potential then this arrangement creates a circuit between the contact leaf and a ground through the component. The important thing to note is that the circuit is created at the contact finger and therefore very near the device lead impinged by the contact finger. Thus a device lead can be capacitively bypassed or resistively terminated essentially right at the device lead. Such close proximity bypassing and termination is very important when testing a device with high frequency signals having extremely short wavelengths.

In its formed but unassembled state the ground frame is coplanar with the contact leaves up to the bends 66 and beyond to the beginning of bend 68. When the rocker assembly 123 is assembled, the saddle of the bend 68 is forced to seat on the crenelated angle ridge 94. The relative position of the angle ridge 94 to the shoulder 102A causes the ground frame 42 to bend away from the plane of the contact leaves 46 at the line of divergence 52 which is along the lateral crimp line of the contact leaf bank 40. This divergence of the ground frame and the rocker body 78 away from the contact fingers 54 (those portions of the contact leaves beyond the line of divergence 52) allows room for the fingers to flex during lead impingement.

A contact assembly 2 has two spaced-apart, parallel rocker assemblies 123 with a base end portion of their respective contact leaf banks 40 separately anchored in the junctions, 34 and 36, between the central base piece 8 and the outer base pieces, 10 and 12 respectively. The two rocker assemblies are hinged by the portions of their respective flexible contact leaf banks intermediate the base plate 4 and the rocker bar 72 and are oriented to reciprocatingly rotate oppositely to each other such that the contact fingers 54 of the two rocker assemblies face each other. Thus, the device leads 56 on one side of a device 58 seated on a device rail 128 interposed between the two rocker assemblies will be impinged by the contact fingers of one rocker assembly while the device leads on the other side of the device will be impinged by the contact fingers of the other rocker assembly.

Referring again to FIG. 1 and 3, it can be seen that the bent portion of the contact fingers 54 overhang a straight edge 124 of the guard plate 120. (The righthand bank of contact fingers in FIG. 1 are not overhanging the guard plate because the guard plate, rocker bar, and contact leaf bank are shown spread apart as they would naturally be when the component cover bar 110 is unbolted from the support bar 112.) In operation, this edge limits the extent of flexing a contact tip undergoes when it impinges a device lead. As the rocker assembly 123 is rotated toward a line of device leads and the contact fingers are brought to bear against with the device leads, the contact fingers will be flexed backward by the leads causing the tips of the contact fingers to ride up the leads and thus wipe them. At a suitable point after initial contact, the straight edge comes into abutment with all the device leads and will thereafter prevent further backward flexing of the contact leaves.

A pair of guard plate flanges 126 disposed at opposite ends of the guard plate project beyond the straight edge 124 and abut the rocker stops 90. The rocker bar 72 and the guard plate 120 are long enough to allow their respective stops and flanges to straddle the device. If no device is present when the rocker assembly is rotated, the guard plate flanges 126 encounter a device guide rail 128, the guide rail upon which the device under test is seated, and rotation of the rocker assembly toward the missing device is halted, thereby protecting the fingers 54 from contact with the guide rail 128. After the rocker assembly is stopped, over-travel springs in the actuating mechanism (as will be explained) absorb any excess travel. The guide rail 128 is made of aluminum which is covered by a dielectric surface finish such as obtained by hard coat anodizing. This prevents accidental shorting of device leads 56. The top surface 128A, however, exposes bare metal to the body of device 58, preventing the accumulation of destructive electrostatic charges between the devices and the contactor.

Figure 9:
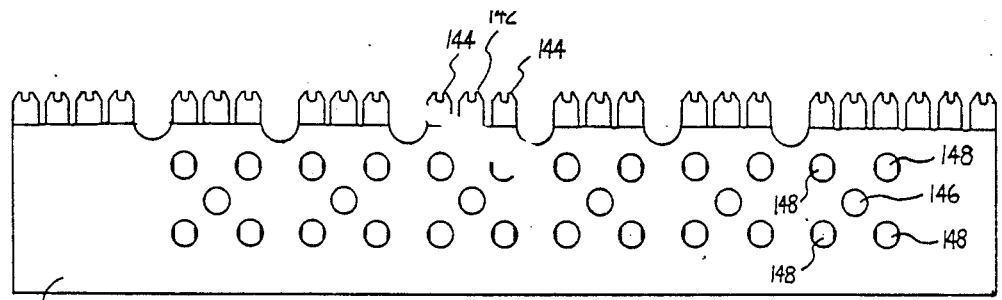
FIG. 9 is a bottom view of an unformed connector adaptor.
Figure 10:
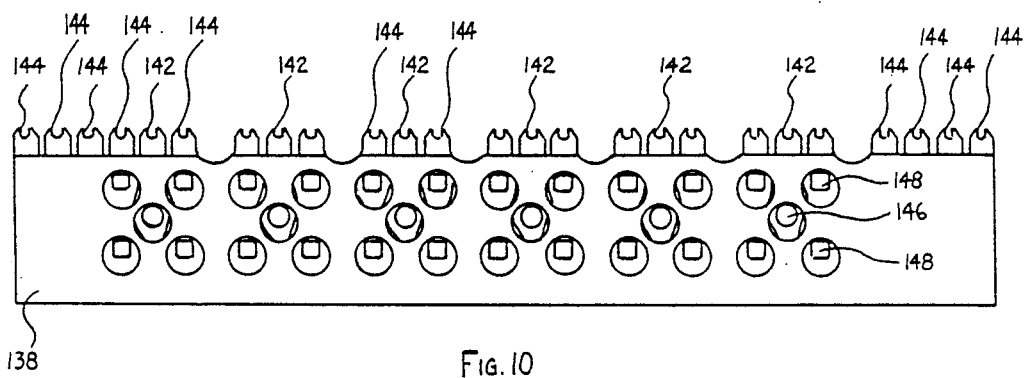
FIG. 10 is a top view of the unformed connector adaptor.
Figure 12:
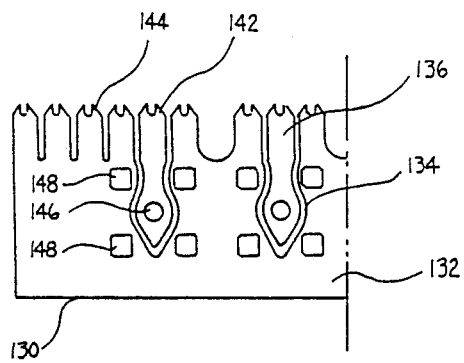
FIG. 12 is a partial plan view of an unlaminated connector adaptor.
Figure 11:
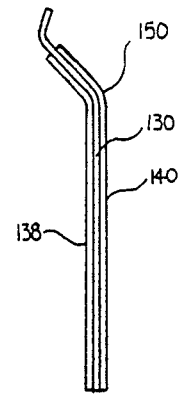
FIG. 11 is a short edge view of a formed connector adaptor.

Referring to FIGS. 9–12, various views of a connector adaptor 130 are shown, FIGS. 9, 10 and 12 showing an unformed adaptor and FIG. 11 showing a formed adaptor. In FIG. 12, the connector adaptor is shown to comprise a sheet of resiliently flexible, electrically conductive material in the form of a generally rectangular ground frame 132 defining a plurality of uniformly-spaced, elongated, uniform, parallel slots 134 in which are disposed a corresponding plurality of uniform, elongated strips of resiliently flexible, electrically conductive material in the form of contact leaves 136, one contact leaf centrally disposed in each slot. FIGS. 9–11 show that the contact leaves 136 and the ground frame 132 are secured in relation to each other by laminates 138 and 140 which sandwich the ground frame and contact leaves therebetween. One long edge of the adaptor comprises a plurality of serrated contact fingers: leaf fingers 142 and ground fingers 144. The leaf fingers 142 are free (unlaminated) ends of the contact leaves 136, and the ground fingers 144 are unlaminated projections of the ground frame 132. An end portion of each contact leaf opposite its respective leaf finger 142 defines a signal lead solder hole 146 and radially disposed around said hole in a square pattern are four ground lead solder holes 148 defined by the ground frame. Each set of four ground and one signal solder holes is adapted to match and align with the leads of a coaxial connector 20 shown in FIG. 3. Each of the connectors 20 has a signal lead 26 centered amongst four ground leads 24. As shown in FIG. 3, the leads project through the holes and solder connections are made such that the four ground leads of each connector are in electrical communication with the ground frame 132 and the signal lead is in electrical communication with a contact leaf 136. FIG. 9 shows a side of the connector adaptor 130 in which the laminate covers all except for the holes themselves and the contact fingers. FIG. 10 shows an opposite side of the adaptor where the laminate 138 defines sufficient clearance around the holes for the solder connections. FIG. 12 shows a portion of the adaptor prior to lamination. Referring to FIG. 11, it can be seen that the adaptor is bent along two lines parallel to and proximate the long edge having the contact fingers 142 and 144. The two bends together form a generally S-shaped bend 150 when viewed from a short adaptor edge. The bends are made by deforming the material beyond its memory.

For proper testing, the number of contact leaves 46 in a contact leaf bank 40 must at least match in number and spacing the device leads 56 on the side of the bank. For each contact leaf there must be a coaxial connector 20. However, the spacing of the contact leaves does not allow enough room for the required number of coaxial connectors to be in a single line. That is the reason each junction, 34 and 36, between the central base piece 8 and an outer base piece, 10 or 12, has two lines of connectors linearly staggered. Interposed between the two lines of connectors at each junction is roughly a bottom third of the contact leaf bank with a base edge of the contact leaf bank being pinched by the junction. Each connector adaptor 130 provides electrical communication between a single line of connectors and the contact leaf bank. The solder hole sets (each set being one signal lead solder hole 146 surrounded by four ground lead solder holes 148) of each connector adaptor are spaced to match and align with the leads of a single line of coaxial connectors. The adaptors solder onto the connector leads with an insulation strip 152 interposed between the adaptors and the connector barrels. Since the leads of the connectors are generally parallel with the plane of the portion of the contact leaf bank in a junction, the adaptors are disposed normal to the contact leaf bank with the S-shaped bends 150 toward the contact leaf bank. The opposing lines of connectors on either side of a junction are sufficiently close to the contact leaf bank to cause the fingers, 142 and 144, of their respective adaptors to be backwardly flexed so that they impinge the contact leaf bank with pressure and maintain that pressure. The adaptor for one connector line impinges the contact leaf bank on one side and the other adaptor for the other line of connectors impinges the contact leaf bank on the other side. The signal fingers 142 of each adaptor are spaced to impinge on only every other contact leaf 46 and the staggering of the connectors ensures that only one adaptor finger impinges each contact leaf. The ground fingers, however, from both opposing adaptors impinge on all of the ground straps between and outside of the contact leaves to minimize ground impedance.

The use of connector adaptors with resilient contact fingers which impinge the contact leaf bank with pressure is advantageous over a solder connection. With a solderless adaptation of the coaxial connectors to the contact leaf bank, the contact leaf banks can be quickly and easily replaced in cases of wearout or accidental damage without any desoldering and soldering operations. Furthermore, a line of coaxial connectors 20 and the line's adaptor 130 with the insulation therebetween can be assembled as a replaceable unit for likewise quick and easy replacement.

Referring to FIGS. 1 and 3, each contact leaf bank of a rocker assembly is transversally crimped between a pair of skewed jaws 154A and 154B along a line proximate and parallel to its respective junction, 34 or 36, intermediate the junction and the rocker bar 72. There are two pairs of jaws, one pair associated with each junction, and the lines of crimping are generally coplanar with their respective junctions. Each pair of jaws, 154A and 154B, are projections along an edge of a central clamping plate 156 and an edge of an outer clamping plate, respectively, which are disposed in a shallow cavity 159 defined by the base plate. The central clamping plate 156 extends between the two opposing contact leaf banks, and has two such jawed edges on opposite sides bearing against the inboard sides of the contact leaf banks, and the outer clamping plates, 158A and 158B, each have a jawed edge bearing against an outboard side of a corresponding contact leaf bank. The clamping plates are superimposed on the connector adaptors and the insulation strips 152, and they define bores into which the leads of the connectors extend. The clamping plates and their jaws are at least as long as the contact leaf banks are wide. The crimping by the jaws cooperates with the pinching of the contact leaf banks by the base pieces to stiffly hold the contact leaf banks therebetween for continuous and reliable contact between the contact leaf bank and the fingers of the connector adaptors. The line of crimping also provides a firm fulcrum line about which the rocker assemblies are hinged by their respective contact leaf banks.

Referring to FIGS. 13-15 a bridge, generally designated 160, is seen to comprise a rectangular housing 162, a cover 164, and two oppositely reciprocating rocker actuating mechanisms, generally designated 166. The bridge 160 is superimposed upon the contact assembly 2 such that the housing 162 abuts a top margin of the contact assembly base plate 4 and is bolted thereto by means of bolts (not shown) extending through contact assembly counter-sunk bolt holes 168 (see FIGS. 1 and 2) and bridge bolt holes 170. When the bridge is superimposed upon the contact assembly, the opposing rocker assemblies 123 project through gaps 172A and 172B between the device rail 128 and the actuating mechanisms 166, and straddle the device guide rail.

The housing 162 is basically a rectangular frame having long frame members 174A and 174B and short frame members 176A and 176B made from material characterized by mechanical strength and high thermal insulation. The contactor of this invention is used to test devices at variable temperature, so in operation the contactor is mounted in a controlled-environment chamber wall aperture (not shown) with one side of the wall being at variable temperature extremes and the other side being at a stable temperature favorable to testor electronics. A function of the housing is to provide a thermal barrier to protect the base plate from the varying and extreme temperatures. To further enhance its thermal insulation characteristics, the housing frame members define a plurality of air trapping cavities 178A and 178B on the sides facing the base plate 4 and the cover 164. Air having a very low thermal coefficient helps to minimize heat transfer from the cover to the base plate. Extending inward along the base plate side of the housing are a pair of integral flanges 180A and 180B to provide further thermal insulation. When the bridge is superimposed onto the contact assembly, the extents of the plates 158A and 158B which, together with the central clamping plate 156, provide a comprehensive thermal barrier for the base plate. The housing also has four uniform and parallel, integral guide rails 182 projecting inward from the long frame members at the frame corners.

Referring to FIG. 13, a conventional contactor drive mechanism is seen to comprise a solenoid 184 powered by an energy source 186 and controlled by a switching means 188. The solenoid acts against a biasing spring 189. The shaft 190 of the solenoid is adapted to engage a pair of cranks 192A and 192B to reciprocatingly turn the cranks in opposite directions through a suitable angle. Affixed to each crank is a drive shaft 194 to which is affixed a drive dog 196. The drive shafts rotate coaxially with the cranks, and the drive dogs are moved through an arc as indicated by the arrows.

Referring to FIG. 14-16, an actuating mechanism 166 is seen to comprise a leader bar 198 with two integral sliders 200A and 200B at opposite ends which slidably travel on the housing guide rails 182, a spaced follower bar 202 parallel to the leader bar with two integral sliders 204A and 204B at opposite ends which slidably travel on the housing guide rails 182, a spring means comprising a pair of coiled springs 206 linking the two bars, a pair of hook-like links 208 affixed to opposite ends of the follower bar and adapted to hook over the rocker dogs 88 at opposite ends of a rocker assembly 123 when the bridge is superimposed upon the contact assembly 2, a drive dog gap 210 between the leader and follower bars, and bearing inserts 212A and 212B between the drive dog and te bars. In FIG. 16 the drive dogs 196 are shown in phantom in the gaps 210, and the directions of drive dog movement are shown by the arrows beneath them.

In operation, when the drive dogs are moving inboard, that is, toward the center of the bridge, they forcibly press against the bearing inserts 212A of the leader bars 198 moving said bars with them. The follower bars 202 because they are linked to the leader bars by the coiled springs 206 will follow bringing the rocker dog links with them. The rocker dog links will force the rocker assemblies 123 to rotate inboard toward the device rail 128, and if a device is seated on the rail, the contact fingers 54 at some point will impinge the device leads and begin flexing backward and wiping the leads. At a further point the guard plates will meet the device leads and will, due to the resistance of the leads, stop any further inboard rotation of the rocker assemblies. Even if the resistance of the leads does not stop the inboard rotation, the guard plate flanges 126 will meet the device rail and stop said rotation before the contact fingers can be shorted or damaged. If the drive dogs continue their inboard course after the rocker assemblies have been stopped, the over-travel will be taken up by the coiled springs, that is, if the leader bars continue to be forced inboard while the follower bars are stopped by the guard plates, the coiled springs will expand to allow the drive dogs to over-travel. Limits to the over-travel are provided by a shoulder 214 (see FIG. 3) of each outer clamping plate 158 which presents a stop in the path of its corresponding leader bar.

Referring to FIGS. 17-19, a conventional contactor is shown to comprise a plurality of individually assembled contact fingers 250 disposed in a two layered base 252 and actuated by a reciprocating slide member 254. It should be noted that the conventional contactors are hand-assembled, that is, each individual contact finger must be assembled and hand-placed into its base.

The foregoing description and drawings were given for illustrative purposes only, it being understood that the invention is not limited to the embodiments disclosed, but is intended to embrace any and all alternatives, equivalents, modifications and rearrangements of elements falling within the scope of the invention as defined by the following claims.

I claim:
1. An electrical device contactor comprising:
 (a) a base member,
 (b) a pair of resiliently flexible, spaced contact leaf banks each having a base portion anchored in the base member, each contact leaf bank comprising:
  (1) a uniform sheet of resiliently flexible, electrically conductive material,
  (2) a plurality of elongated leaves of resiliently flexible, electrically conductive material, end portions of each leaf being a contact finger,
  (3) a corresponding plurality of uniformly-spaced, elongated, parallel slots defined by the sheet in which the leaves are uniformly and centrally disposed, one leaf in each slot, the leaves being generally coplanar with the sheet except for the contact fingers which diverge inboardly from the plane of the sheet, and
  (4) means securing the leaves and the sheet in relation to each other,
 (c) a device seating means interposed between the contact leaf banks and for seating an electrical device such that each external lead of the device is aligned with a contact finger,
 (d) an actuating means cooperating with the contact leaf banks to cause the contact fingers of each contact leaf bank to alernatingly impinge and move away from device leads, and
 (e) an adaptor means in electrical contact with the contact leaf bank and for providing electrical communication access to the contact fingers.

2. The contactor of claim 1 wherein the actuating means comprises:
 (a) a pair of rocker means, one rocker means being laterally affixed, to each of the contact leaf banks proximate the bank's contact fingers, the portion of each contact leaf bank intermediate the base member and its respective rocker means being flexible to allow said rocker means to swing between two positions, a first position wherein the contact fingers impinge the device leads and a second position wherein said contact fingers are suitably spaced from said device leads,
 (b) means associated with each rocker means for swinging said rocker means between its first position and its second position.

3. The contactor of claim 2 wherein the rocker means further comprises a plurality of component cells defined by the rocker means, each cell being aligned with a single contact leaf, each cell being adapted to hold a component having a pair of electrodes such that a first electrode is in electrical contact with the aligned contact leaf, and means for providing electrical communication between the second electrode and an electrical 4. The contactor of claim 2 wherein the contact leaf bank and the rocker means further comprise:
   (a) a hook-like lateral bend of a top portion of each contact leaf bank in a direction away from a device rail,
   (b) a rocker bar secured in the saddle of each hook-like bend,
   (c) a plurality of electrically insulated component cells defined by the rocker bar, the component cells extending through the rocker bar, each cell being aligned with a contact leaf, each cell being adapted to hold one component with a pair of oppositely disposed electrodes such that when a component is in a cell, a first electrode of the component makes electrical contact with the contact leaf with which the cell is aligned.
   (d) crenelations defined by an edge of the contact leaf bank remote from the base member, the merlons of the crenelation being aligned with the component cells and being inwardly bent so that each merlon intrudes into the cell with which it is aligned and makes electrical contact with a second electrode of the component, and
   (e) means for coupling the actuating mechanism to the rocker bars.

5. The contactor of claim 2 wherein the rocker means further comprises a pair of elongated guard plates, a portion of each contact leaf bank being vised between a guard plate and a rocker bar, each guard plate being adapted to stop inboard rotation of the rocker means at a suitable points to prevent damage to the contact fingers.

6. The contactor of claim 2 wherein the actuating mechanism comprises:
   (a) a leader bar adapted to reciprocatingly slide in a plane,
   (b) a spaced follower bar adapted to reciprocatingly slide in the same plane,
   (c) a spring means urging the two bars together,
   (d) a drive dog disposed in the space between the bars and operable to reciprocatingly move under power,
   (e) means linking the follower bar to a ocker means such that as the leader bar is made to move inboard by inboard movement of the drive dog, the follower bar is pulled along by tension of the spring means and the linking means causes the rocker means to correspondingly rotate inboard.

7. The contactor of claim 6 further comprising a pair of stop means adapted to stop inboard movement of the rocker means at points suitable to prevent damage or shorting of the contact fingers, and wherein the linking means is further adapted to stop movement of the follower bar when the rocker means is so stopped, any over-travel of the drive dog being compensated by expansion of the spring means.

8. The contactor of claim 7 wherein the means for linking a follower bar to a rocker means comprises a pair of oppositely and axially extending rocker dogs projecting from opposite ends of the rocker means, and a pair of hook links affixed at opposite ends of the follower bars which are adapted to hook the rocker dogs.

9. An electrical device contactor comprising:
   (a) a pair of resiliently flexible, spaced contact leaf banks each having a base portion anchored, each also having a plurality of contact leaves, an unanchored end portion of each contact leaf being a contact finger inboardly divergent from its respective contact leaf bank,
   (b) a device seating means interposed between the contact leaf banks for seating an electrical device, each external lead of the device being aligned with a contact finger,
   (c) a pair of rocker means, one each being laterally affixed to the contact leaf banks proximate the banks contact fingers, each contact leaf bank being flexible to allow its respective rocker means to swing between two positions, a first position wherein the contact fingers impinge the device leafs and a second position wherein said contact fingers are suitably spaced from said device leads,
   (d) a plurality of component cells defined by each rocker means, each cell being aligned with a single contact leaf, each cell being capable of holding a component having a pair of electrodes, a first electrode being in electrical contact with the aligned contact leaf.
   (e) means for providing electrical communication between the second electrode and an electrical reference means,
   (f) means for swinging each of said rocker means between their respective first and second positions, and
   (g) an adaptor means in electrical contact with the contact leaf bank and for providing electrical communication access to the contact fingers.

10. An electrical device contactor comprising:
   (a) a pair of resiliently flexible, spaced contact leaf banks each having a base portion anchored, each contact leaf bank comprising:
      (1) a plurality of contact leaves, an unanchored end portion of each contact leaf being a contact finger, and
      (2) an electrical reference plane generally coplanar with the contact leaves and extending around and between said contact leaves, the contact fingers being divergent inboardly from said reference plane and a portion of said reference plane beyond said contact fingers being folded back outboardly in a hook-like lateral bend,
   (b) a device seating means interposed between the contact leaf banks for seating an electrical device, each external lead of the device being aligned with a contact finger,
   (c) an elongated rocker bar affixed in a saddle of each of said hook-like lateral bends, each contact leaf bank being flexible to allow said rocker bar to swing between two positions, a first position wherein the contact fingers impinge the device leads and a second position wherein said contact fingers are suitably spaced from said device leads,
   (d) a plurality of electrically insulated component cells defined by at least one of the rocker bars, the component cells extending through its rocker bar, each cell being aligned with a contact leaf, each cell having the capacity to hold at least one component having a pair of oppositely disposed electrodes, a first electrode of a component in a cell being in electrical contact with the contact leaf with which the cell is aligned,
(e) crenelations defined by each of the electrical reference planes along margins which are the ends of their respective hook-like lateral bends, each merlon of the crenelations being aligned with a component cell and being inwardly bent so that each merlon intrudes into the cell with which it is aligned and makes electrical contact with a second electrode of a component therein,
(f) means for swinging each of said rocker bars between their respective first and second positions, and
(g) an adaptor means in electrical contact with the contact leaf bank and for providing electrical communication access to the contact fingers.

11. An electrical device contactor comprising:
(a) pair of resiliently flexible, spaced contact leaf banks each having a base portion anchored, each also having a plurality of contact leaves, an unanchored end portion of each contact leaf being a contact finger inboardly divergent from its respective contact leaf bank,
(b) a device seating means interposede between the contact leaf banks for seating an electrical device, each external lead of the device being aligned with a contact finger,
(c) a pair of rocker bars, one each being laterally, affixed to the contact leaf banks proximate the bank s contact fingers, each contact leaf bank being flexible to allow its respective rocker bar to swing between two positions, a first position wherein the contact fingers impinge the device leads and a second position wherein said contact fingers are suitably spaced from said device leads,
(d) means for swinging each of said rocker bars between their respective first and second positions,
(e) a pair of elongated guard plates, a portion of each contact leaf bank being vised between a guard plate and a rocker bar, each guard plate being operative to stop inboard rotation of its respective rocker bar at a suitable point to prevent damage to the contact fingers, and
(f) an adapter means in electrical contact with the contact leaf bank and for providing electrical communication access to the contact fingers.

12. An electrical device contactor comprising:
(a) a pair of resiliently flexible, spaced contact leaf banks each having a base portion anchored, each also having a plurality of contact leaves, an unanchored end portion of each contact leaf being a contact finger inboardly divergent from its respective contact leaf bank,
(b) a device seating means interposed between the contact leaf banks for seating an electrical device, each external lead of the device being aligned with a contact finger,
(c) a pair of rocker means, one each being laterally, affixed to the contact leaf banks proximate the bank s contact fingers, each contact leaf bank being flexible to allow its respective rocker means to swing between two positions, a first position wherein the contact fingers impinge the device leads and a second position wherein said contact fingers are suitably spaced from said device leads,
(d) separate means for swinging each of said rocker means between their respective first and second positions comprising:
  (1) a leader bar reciprocatingly slidable inboardly and outboardly in a plane,
  (2) a spaced follower bar reciprocatingly slidable inboardly and outboardly in the same plane,
  (3) spring means for urging the two bars together,
  (4) a drive dog disposed in the space between the bars and operable to reciprocatingly move under power,
  (5) means for linking the follower bar to its respective rocker means such that as the leader bar is made to slide inboard by inboard movement of the drive dog, the follower bar is pulled along by tension of the spring means and the linking means causes the rocker means to correspondingly swing inboard, and
(e) an adaptor means in electrical contact with the contact leaf bank and for providing electrical communication access to the contact fingers.

13. The contactor of claim 12 further comprising a pair of means for stopping inboard movement of respective rocker means at their first positions, and wherein each linking means stops movement of its follower bar when its respective rocker means is so stopped, any over-travel of the drive dog being compensated by expansion of the spring means.

14. The contactor of claim 13 wherein the means for linking a follower bar to a rocker means comprises a pair of oppositely and axially extending rocker dogs projecting from opposite ends of the rocker means, and a pair of hook links affixed at opposite ends of the follower bars which are adapted to hook the rocker dogs.

* * * * *

UNITED STATES PATENT AND TRADEMARK OFFICE
CERTIFICATE OF CORRECTION

PATENT NO. : 4,836,797
DATED : June 6, 1989
INVENTOR(S) : Bernd Riechelmann

It is certified that error appears in the above-identified patent and that said Letters Patent is hereby corrected as shown below:

Column 11, claim 3, line 8 after "electrical"

insert --reference means.-- and

Column 11, claim 6, line 51 "ocker" should be --rocker--;

Signed and Sealed this

Ninth Day of October, 1990

Attest:

HARRY F. MANBECK, JR.

*Attesting Officer*  *Commissioner of Patents and Trademarks*